(12) United States Patent
Leshner et al.

(10) Patent No.: US 8,164,359 B2
(45) Date of Patent: Apr. 24, 2012

(54) THRESHOLD LOGIC ELEMENT HAVING LOW LEAKAGE POWER AND HIGH PERFORMANCE

(75) Inventors: Samuel Leshner, Mesa, AZ (US); Sarma Vrudhula, Chandler, AZ (US)

(73) Assignee: Arizona Board of Regents for and on behalf of Arizona State University, Scottsdale, AZ (US)

( * ) Notice: Subject to any disclaimer, the term of this patent is extended or adjusted under 35 U.S.C. 154(b) by 0 days.

(21) Appl. No.: 12/867,352

(22) PCT Filed: Feb. 13, 2009

(86) PCT No.: PCT/US2009/034044
§ 371 (c)(1), (2), (4) Date: Aug. 12, 2010

(87) PCT Pub. No.: WO2009/102948
PCT Pub. Date: Aug. 20, 2009

(65) Prior Publication Data
US 2010/0321061 A1   Dec. 23, 2010

Related U.S. Application Data

(60) Provisional application No. 61/028,384, filed on Feb. 13, 2008.

(51) Int. Cl.
*H03K 19/23* (2006.01)
(52) U.S. Cl. .......................... 326/36; 326/98; 326/113
(58) Field of Classification Search .......... 326/35–36, 326/93, 95, 98, 112–113
See application file for complete search history.

(56) References Cited

U.S. PATENT DOCUMENTS

| | | | | |
|---|---|---|---|---|
| 5,859,548 A * | 1/1999 | Kong | | 326/113 |
| 5,991,789 A * | 11/1999 | Prange et al. | | 708/625 |
| 6,002,270 A * | 12/1999 | Timoc | | 326/98 |
| 6,028,453 A * | 2/2000 | Kong | | 326/113 |
| 6,046,608 A * | 4/2000 | Theogarajan | | 326/121 |
| 6,278,298 B1 | 8/2001 | Hayakawa | | |
| 6,381,181 B1 | 4/2002 | Nguyen | | |
| 6,392,467 B1 * | 5/2002 | Oowaki et al. | | 327/427 |
| 6,420,905 B1 * | 7/2002 | Davis et al. | | 326/113 |
| 6,424,181 B1 * | 7/2002 | Pogrebnoy | | 327/55 |
| 6,437,604 B1 * | 8/2002 | Forbes | | 326/98 |
| 6,580,296 B1 * | 6/2003 | Beiu | | 326/121 |
| 6,838,909 B2 * | 1/2005 | Huang et al. | | 326/95 |
| 7,417,468 B2 * | 8/2008 | Verbauwhede et al. | | 326/112 |
| 2006/0119406 A1 * | 6/2006 | Henzler et al. | | 327/208 |

OTHER PUBLICATIONS

Beiu, Valeriu et al., "VLSI Implementations of Threshold Logic—A Comprehensive Survey," IEEE Transactions on Neural Networks, Sep. 2003, pp. 1217-1243, vol. 14, No. 5, IEEE.
International Search Report for PCT/US09/34044, mailed Aug. 10, 2009.

* cited by examiner

*Primary Examiner* — Jason M Crawford
(74) *Attorney, Agent, or Firm* — Withrow & Terranova, P.L.L.C.

(57) ABSTRACT

Embodiments of a threshold logic element are provided. Preferably, embodiments of the threshold logic element discussed herein have low leakage power and high performance characteristics. In the preferred embodiment, the threshold logic element is a threshold logic latch (TLL). The TLL is a dynamically operated current-mode threshold logic cell that provides fast and efficient implementation of digital logic functions. The TLL can be operated synchronously or asynchronously and is fully compatible with standard Complementary Metal-Oxide-Semiconductor (CMOS) technology.

23 Claims, 9 Drawing Sheets

THRESHOLD LOGIC ELEMENT HAVING LOW LEAKAGE POWER AND HIGH PERFORMANCE

This application is a 35 U.S.C. §371 National Phase filing of PCT/US09/34044 filed Feb. 13, 2009, which claims priority to U.S. provisional application Ser. No. 61/028,384 filed Feb. 13, 2008, the disclosures of which are incorporated herein by reference in their entireties.

BACKGROUND

A threshold logic gate is defined as an n-input processing element having an output defined as:

$$F(X) = \text{sgn}\left\{\sum_{i=0}^{n-1} w_i \cdot x_i - T\right\},$$

where $X=[x_0, x_1, \ldots, x_{n-1}]$, $W=[w_0, w_1, \ldots, w_{n-1}]$, and T are Boolean input variables, the set of fixed signed integer weights associated with data inputs, and a threshold, respectively. A threshold logic gate may be used to implement various types of Boolean functions. There is a need for a threshold logic gate, or element, having low leakage power and high performance characteristics.

SUMMARY

Embodiments of a threshold logic element are described herein. Preferably, embodiments of the threshold logic element discussed herein have low leakage power and high performance characteristics. In the preferred embodiment, the threshold logic element is a Threshold Logic Latch (TLL). The TLL is a dynamically operated current-mode threshold logic cell that provides fast and efficient implementation of digital logic functions. The TLL can be operated synchronously or asynchronously and is fully compatible with standard Complementary Metal-Oxide-Semiconductor (CMOS) technology.

In general, the TLL includes an input gate network, a threshold gate network, and a differential network including an input branch and a threshold branch. In addition, the TLL may include an output component. The input gate network receives a number of data inputs and has an output connected to an isolated control input of the input branch of the differential network. The threshold gate network receives a number of threshold inputs and has an output connected to an isolated control input of the threshold branch of the differential network. Because the input and threshold gate networks are connected to the isolated control inputs of the input branch and the threshold branch, respectively, the TLL is robust to process variations.

The TLL operates in two states: a reset state and an evaluation state. In the reset state, the input and threshold gate networks are deactivated. As a result, in one embodiment, the input and threshold branches operate to pull, or charge, their output nodes to a voltage level corresponding to a logic "1." Next, in the evaluation state, the input and threshold gate networks are activated. As a result, a current race begins between the input and threshold gate networks based on the data and threshold inputs. If the input gate network wins the current race, the input branch of the TLL is activated. When the input branch of the TLL is activated, the input branch discharges the output node of the input branch to a voltage level corresponding to a logic "0." In addition, in response to the activation of the input branch and, more specifically, in response to the discharging of the output node of the input branch, the threshold branch of the TLL is deactivated such that the output of the threshold branch remains charged to a voltage level corresponding to a logic "1." In contrast, if the threshold gate network wins the current race, the threshold branch of the TLL is activated. When the threshold branch of the TLL is activated, the threshold branch discharges the output node of the threshold branch to a voltage level corresponding to a logic "0." In addition, in response to the activation of the threshold branch and, more specifically, in response to the discharging of the output node of the threshold branch, the input branch of the TLL is deactivated such that the output of the input branch remains charged to a voltage level corresponding to a logic "1."

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
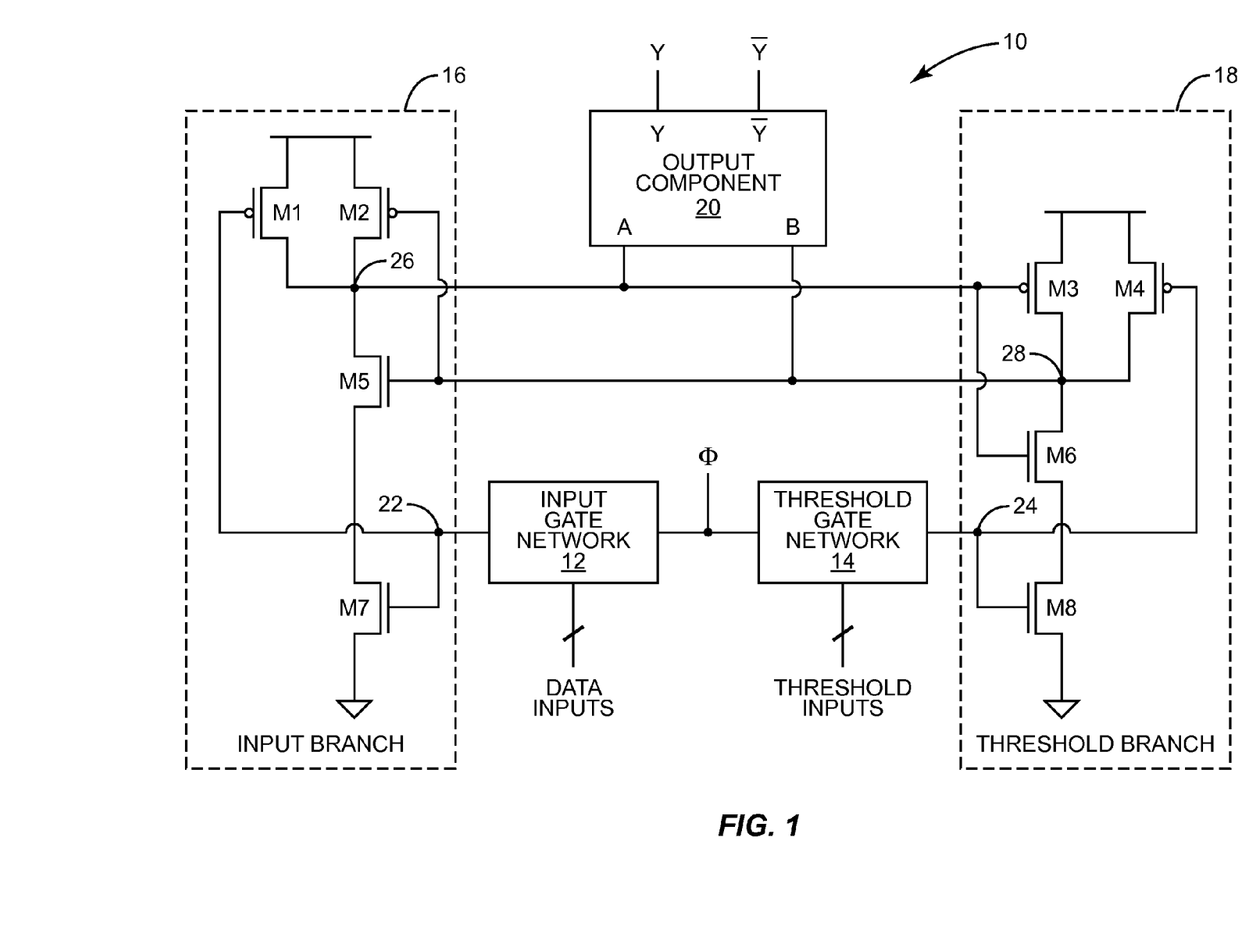
FIG. 1 illustrates a first embodiment of a Threshold Logic Latch (TLL)

FIG. 1 illustrates a first embodiment of a threshold logic element 10. The threshold logic element 10 of FIG. 1 is more specifically referred to as a Threshold Logic Latch (TLL) 10. In general, the TLL 10 includes an input gate network 12, a threshold gate network 14, and a differential network formed by an input branch 16 and a threshold branch 18. In addition, in this embodiment, the TLL 10 includes an output component 20. As discussed below in detail, the input gate network 12 is formed by a number of parallel gates, which may be parallel transmission gates or parallel pass gates. The gates in the input gate network 12 are driven by data inputs. Likewise, the threshold gate network 14 is formed by a number of parallel gates, which may be parallel transmission gates or parallel pass gates. The gates in the threshold gate network 14 are driven by threshold inputs.

The input gate network 12 is driven by the data inputs and has an output connected to an isolated control input 22 of the input branch 16 such that the data inputs operate to control the input branch 16 in the manner described below. The threshold gate network 14 is connected to an isolated control input 24 of the threshold branch 18 such that the threshold inputs operate to control the threshold branch 18 in the manner described below. Because the input and threshold gate networks 12 and 14 are isolated from the input and threshold branches 16 and 18, respectively, the TLL 10 is robust to process variations.

In this embodiment, the input branch 16 is formed by transistors M1, M2, M5, and M7 connected as shown. Likewise, the threshold branch 18 is formed by transistors M3, M4, M6, and M8 connected as shown. The transistors M1 through M8 are preferably Complementary Metal-Oxide-Semiconductor (CMOS) transistors. However, the present invention is not limited thereto. The output component 20 has a first input connected to an output node 26 of the input branch 16 and a second input connected to an output node 28 of the threshold branch 18. Based on the outputs at the output nodes 26 and 28, the output component 20 operates to provide a differential output Y, Y'.

The TLL 10 of FIG. 1 operates in two states: a reset state and an evaluation state. The state of the TLL 10 is controlled by a bias signal Φ, which may also be referred to as a clock signal for the TLL 10. In order to enter the reset state, the bias signal Φ is set to a voltage level corresponding to a logic "0." As a result, the input and threshold gate networks 12 and 14 are deactivated such that the outputs of the input and threshold gate networks 12 and 14, and thus the isolated control inputs 22 and 24 of the input and threshold branches 16 and 18, are discharged or pulled to a voltage level corresponding to a logic "0." When the isolated control inputs 22 and 24 of the input and threshold branches 16 and 18 are pulled to logic "0," the transistors M7 and M8 are inactive and the transistors M1 and M4 are active. As a result, the output nodes and 26 and 28 of the input and threshold branches 16 and 18, respectively, are pulled to a voltage level corresponding a logic value "1" via the transistors M1 and M4. Once reset is complete, the transistors M1, M4, M5, and M6 are active, and the remaining transistors M2, M3, M7, and M8 are inactive. At this point, the TLL 10 is primed for evaluation.

On the rising edge of the bias signal Φ, the TLL 10 transitions to the evaluation state. In the evaluation state, either the output node 26 of the input branch 16 or the output node 28 of the threshold branch 18 is pulled to a logic "0," which may result in a transition in outputs Y and Y' of the output component 20. More specifically, as the bias signal Φ rises, a current race begins between the input and threshold gate networks 12 and 14. The input gate network 12 wins the current race if the input gate network 12 charges the output of the input gate network 12 to a voltage level sufficient to activate the transistor M7 and deactivate the transistor M1 before the threshold gate network 14 charges the output of the threshold gate network 14 to a voltage level sufficient to activate the transistor M8 and deactivate the transistor M4. In one embodiment, the input gate network 12 wins the current race if the number of gates in the input gate network 12 activated by the data inputs is larger than the number of gates in the threshold gate network 14 activated by the threshold inputs. Likewise, the threshold gate network 14 wins the current race if the threshold gate network 14 charges the output of the threshold gate network 14 to a voltage level sufficient to activate the transistor M8 and deactivate the transistor M4 before the input gate network 12 charges the output of the input gate network 12 to a voltage level sufficient to activate the transistor M7 and deactivate the transistor M1. In one embodiment, the threshold gate network 14 wins the current race if the number of gates in the threshold gate network 14 activated by the threshold inputs is larger than the number of gates in the input gate network 12 activated by the data inputs.

If the input gate network 12 wins the current race, the output of the input gate network 12, and thus the isolated control input 22 of the input branch 16, reaches a logic "1" before the output of the threshold gate network 14, and thus the isolated control input 24 of the threshold branch 18, reaches a logic "1." As the isolated control input 22 of the input branch 16 reaches a logic "1," the transistor M1, which is a p-type Metal-Oxide-Semiconductor (PMOS) device, becomes inactive, thereby cutting off the path from the output node 26 of the input branch 16 to the supply voltage. In addition, the transistor M7, which is an n-type Metal-Oxide-Semiconductor (NMOS) device, becomes active, thereby pulling the output node 26 of the input branch 16 towards ground through the transistor M5. As the output node 26 of the input branch 16 discharges, the transistor M3 of the threshold branch 18, which is a PMOS device, becomes active and the transistor M6 of the threshold branch 18, which is an NMOS device, becomes inactive. Thus, at some point thereafter when the output of the threshold gate network 14, and thus the isolated control input 24 of the threshold branch 18, reaches a logic "1," the output node 28 of the threshold branch 18 does not discharge. At the end of the evaluation, the output node 26 of the input branch 16 is at a logic "0," and the output node 28 of the threshold branch 18 is at a logic "1." The outputs Y and Y' of the output component 20 are adjusted accordingly by the output component 20.

Similarly, if the threshold gate network 14 wins the current race, the output of the threshold gate network 14, and thus the isolated control input 24 of the threshold branch 18, reaches a logic "1" before the output of the input gate network 12, and thus the isolated control input 22 of the input branch 16, reaches a logic "1." As the isolated control input 24 of the threshold branch 18 reaches a logic "1," the transistor M4, which is a PMOS device, becomes inactive, thereby cutting off the path from the output node 28 of the threshold branch 18 to the supply voltage. In addition, the transistor M8, which is an NMOS device, becomes active, thereby pulling the output node 28 of the threshold branch 18 towards ground through the transistor M6. As the output node 28 of the threshold branch 18 discharges, the transistor M2 of the input branch 16, which is a PMOS device, becomes active and the transistor M5 of the input branch 16, which is an NMOS device, becomes inactive. Thus, at some point thereafter when the output of the input gate network 12, and thus the isolated control input 22 of the input branch 16, reaches a logic "1," the output node 26 of the input branch 16 does not discharge. At the end of the evaluation, the output node 26 of the input branch 16 is at a logic "1," and the output node 28 of the threshold branch 18 is at a logic "0." The outputs Y and Y' of the output component 20 are adjusted accordingly by the output component 20.

Note that after evaluation completes, all nodes in the TLL 10 have a closed path to either the supply voltage or ground. Because of this, the outputs are latched, and no change in the active number of transmission gates in either of the input and threshold gate networks 12 and 14 will have any effect on the values at the outputs until the beginning of the next evaluation.

Further, note that whether the input gate network 12 or the threshold gate network 14 wins the current race may depend on the number of active transmission gates, as discussed above. However, transistor size or gate widths for the gates forming the input and threshold gate networks 12 and 14 may vary in order to allow weighting of the data and threshold inputs. Thus, in this case, the current race may depend on the number of active gates and the sizes or widths of those active gates. Also note that weighting may be performed by allocation of one or more gates per input or, in other words, by providing a single input to multiple gates.

Figure 2A:
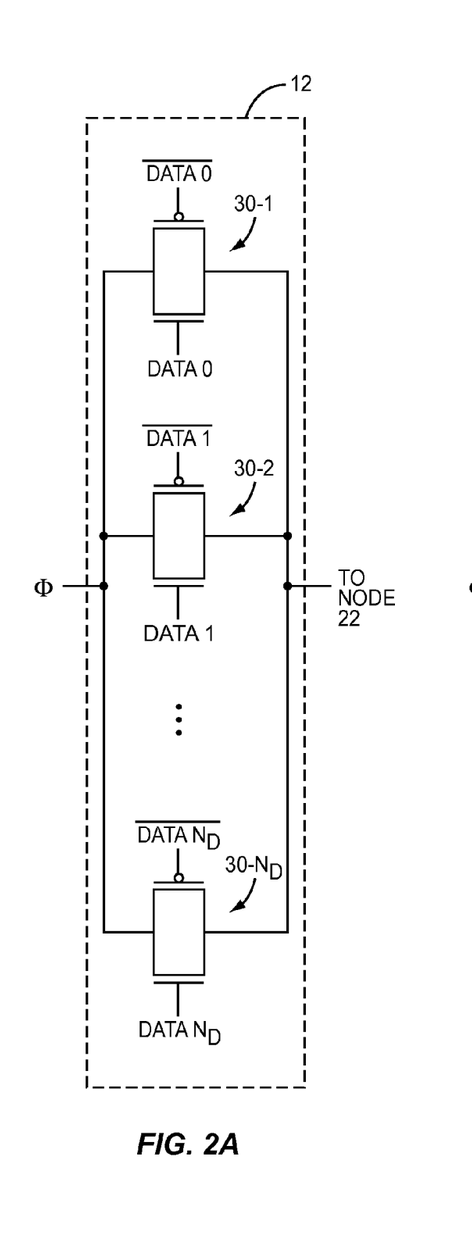
FIGS. 2A and 2B illustrate first embodiments of the input and threshold gate networks of the TLL of FIG. 1.
Figure 2B:
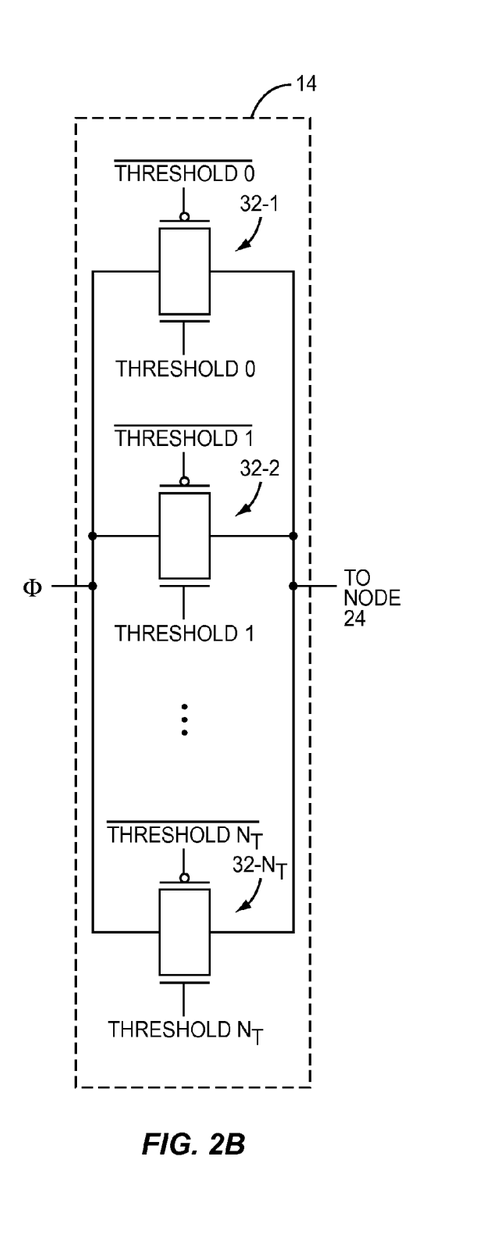

FIGS. 2A and 2B illustrate first embodiments of the input and threshold gate networks 12 and 14, respectively. In this embodiment, the input and threshold gate networks 12 and 14 are implemented as transmission gate networks. Specifically, as illustrated in FIG. 2A, the input gate network 12 is formed by a number of transmission gates 30-1 through 30-$N_D$ connected in parallel as shown. The bias signal $\Phi$ deactivates the transmission gates 30-1 through 30-$N_D$ when at a low voltage level (i.e., at a logic "0") and activates the transmission gates 30-1 through 30-$N_D$ when at a high voltage level (i.e., at a logic "1"). Likewise, as illustrated in FIG. 2B, the threshold gate network 14 is formed by a number of transmission gates 32-1 through 32-$N_T$ connected in parallel as shown. The bias signal $\Phi$ deactivates the transmission gates 32-1 through 32-$N_T$ when at a low voltage level (i.e., at a logic "0") and activates the transmission gates 32-1 through 32-$N_T$ when at a high voltage level (i.e., at a logic "1"). Note that the number of gates ($N_D$) in the input gate network 12 and the number of gates ($N_T$) in the threshold gate network 14 may or may not be equal depending on the particular implementation.

Figure 3A:
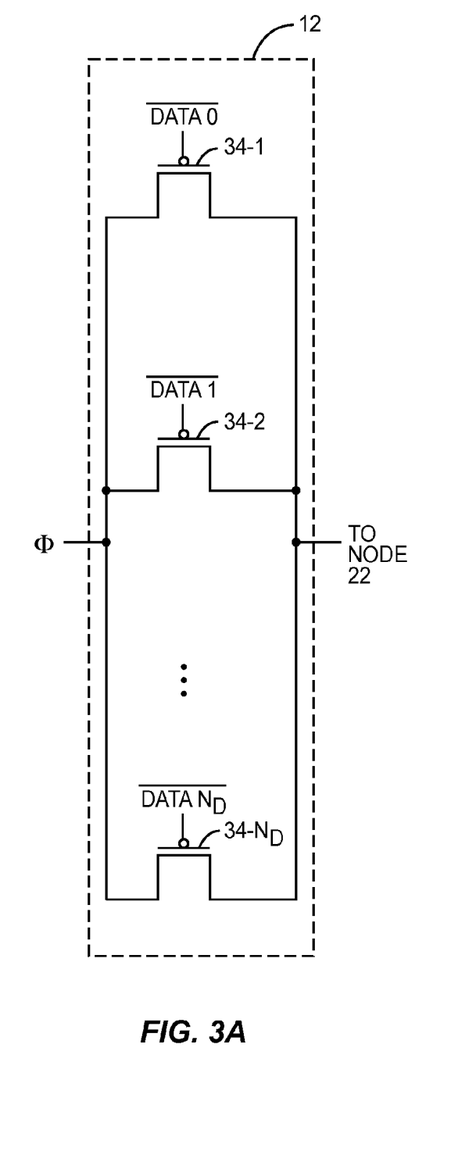
FIGS. 3A and 3B illustrate second embodiments of the input and threshold gate networks of the TLL of FIG. 1.
Figure 3B:
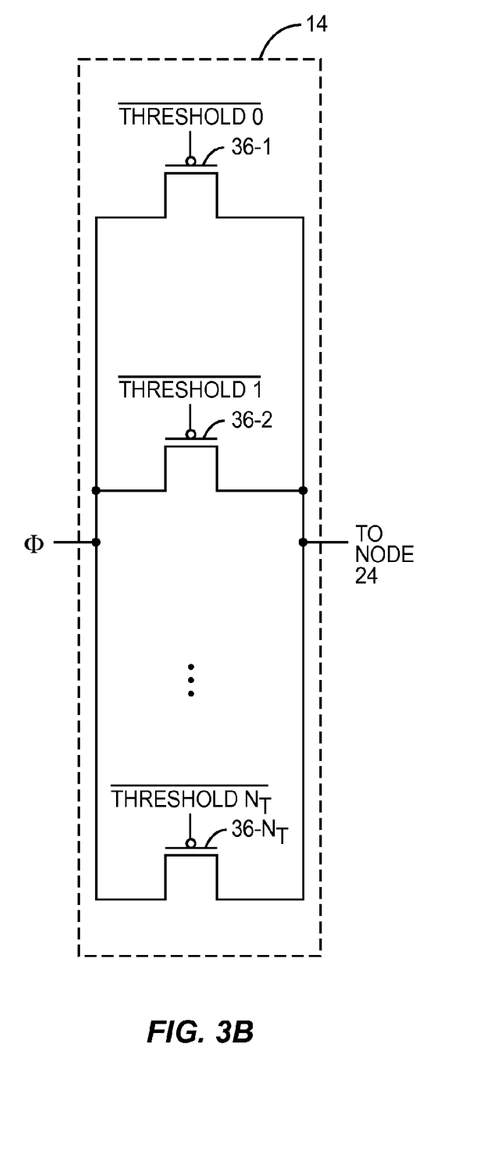

FIGS. 3A and 3B illustrate second embodiments of the input and threshold gate networks 12 and 14, respectively. In this embodiment, the input and threshold gate networks 12 and 14 are implemented as PMOS pass gate networks. Specifically, as illustrated in FIG. 3A, the input gate network 12 is formed by a number of PMOS pass gates 34-1 through 34-$N_D$ connected in parallel as shown. The bias signal $\Phi$ deactivates the PMOS pass gates 34-1 through 34-$N_D$ when at a low voltage level (i.e., at a logic "0") and activates the PMOS pass gates 34-1 through 34-$N_D$ when at a high voltage level (i.e., at a logic "1"). Likewise, as illustrated in FIG. 3B, the threshold gate network 14 is formed by a number of PMOS pass gates 36-1 through 36-$N_T$ connected in parallel as shown. The bias signal $\Phi$ deactivates the PMOS pass gates 36-1 through 36-$N_T$ when at a low voltage level (i.e., at a logic "0") and activates the PMOS pass gates 36-1 through 36-$N_T$ when at a high voltage level (i.e., at a logic "1"). Again, note that the number of gates ($N_D$) in the input gate network 12 and the number of gates ($N_T$) in the threshold gate network 14 may or may not be equal depending on the particular implementation.

Figure 4A:
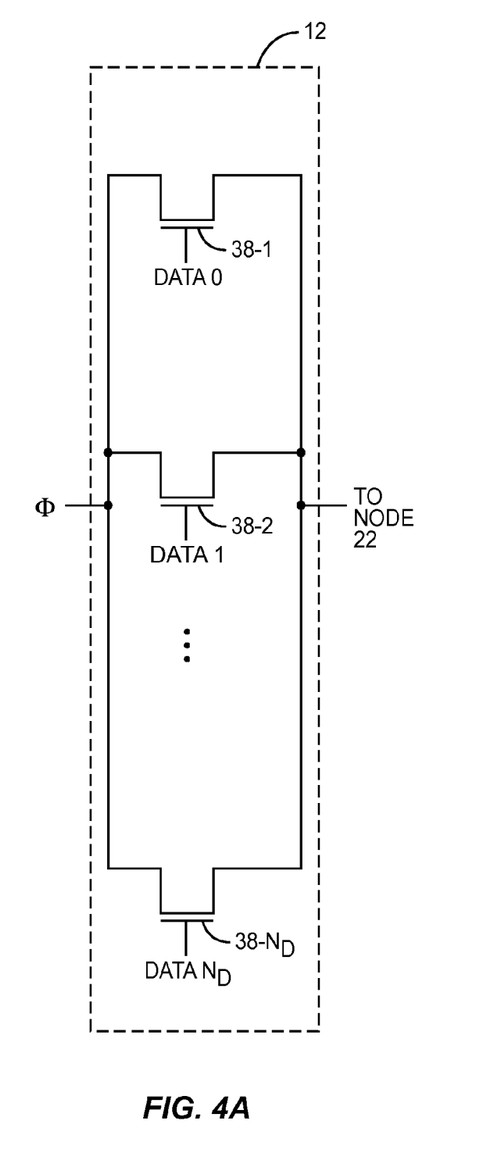
FIGS. 4A and 4B illustrate third embodiments of the input and threshold gate networks of the TLL of FIG. 1.
Figure 4B:
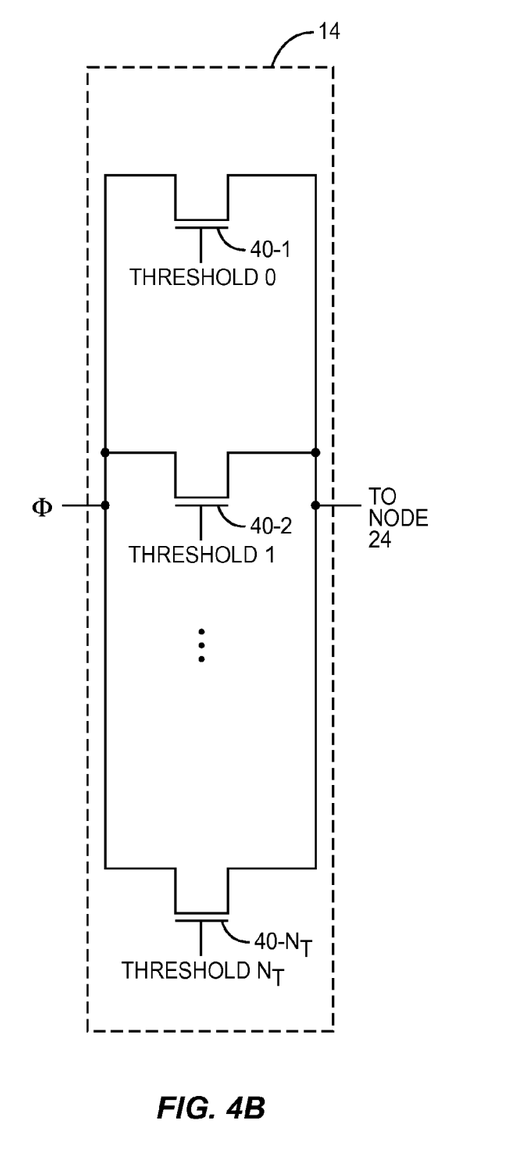

FIGS. 4A and 4B illustrate third embodiments of the input gate network 12 and the threshold gate network 14, respectively. In this embodiment, the input and threshold gate networks 12 and 14 are implemented as NMOS pass gate networks. Specifically, as illustrated in FIG. 4A, the input gate network 12 is formed by a number of NMOS pass gates 38-1 through 38-$N_D$ connected in parallel as shown. The bias signal $\Phi$ deactivates the NMOS pass gates 38-1 through 38-$N_D$ when at a low voltage level (i.e., at a logic "0") and activates the NMOS pass gates 38-1 through 38-$N_D$ when at a high voltage level (i.e., at a logic "1"). Likewise, as illustrated in FIG. 4B, the threshold gate network 14 is formed by a number of NMOS pass gates 40-1 through 40-$N_T$ connected in parallel as shown. The bias signal $\Phi$ deactivates the NMOS pass gates 40-1 through 40-$N_T$ when at a low voltage level (i.e., at a logic "0") and activates the NMOS pass gates 40-1 through 40-$N_T$ when at a high voltage level (i.e., at a logic "1"). Again, note that the number of gates ($N_D$) in the input gate network 12 and the number of gates ($N_T$) in the threshold gate network 14 may or may not be equal depending on the particular implementation.

Figure 5A:
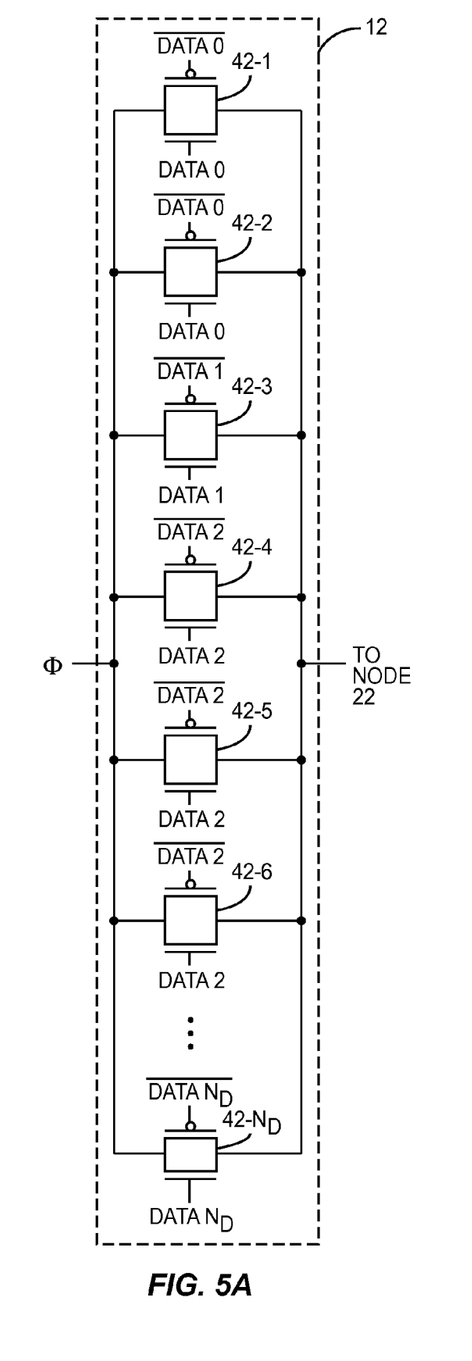
FIGS. 5A and 5B illustrate fourth embodiments of the input and threshold gate networks of FIG. 1 wherein weighting is applied by connecting each input to one or more gates to provide desired weightings for the inputs.
Figure 5B:
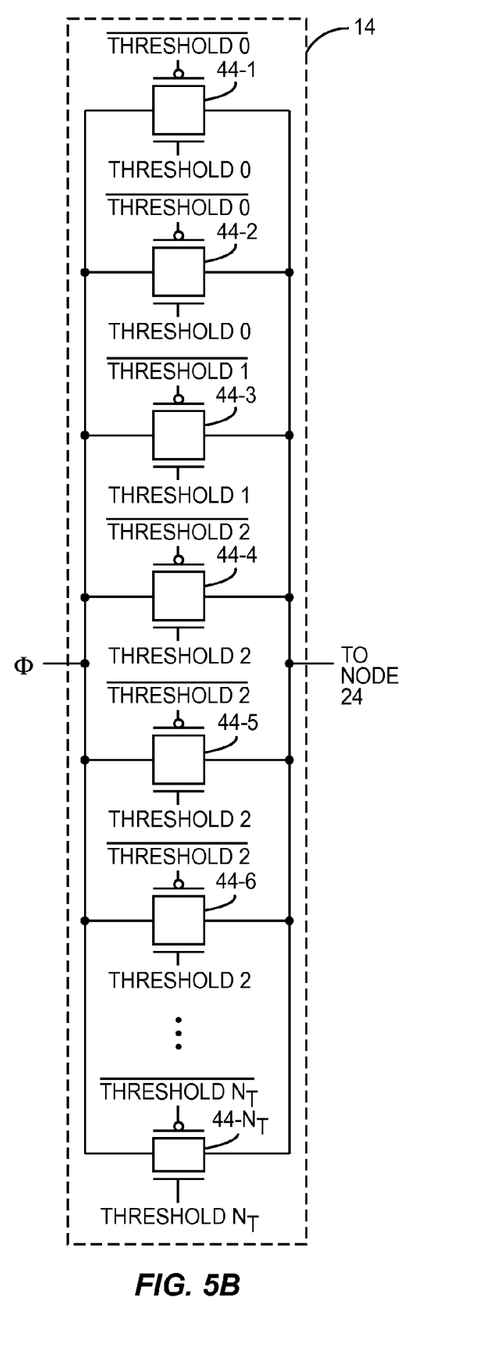

FIGS. 5A and 5B illustrate another embodiment of the input and threshold gate networks 12 and 14 wherein weightings are applied to the data and threshold inputs by allocating one or more gates to each input. Note that while FIGS. 5A and 5B illustrate the gates of the input and threshold gate networks 12 and 14 as transmission gates, this discussion is equally applicable whether the gates are transmission gates, PMOS pass gates, or NMOS pass gates. As illustrated in FIG. 5A, in this embodiment, the input gate network 12 is implemented as a number of gates 42-1 through 42-$N_D$ connected in parallel as shown. In contrast to the embodiments discussed above where there is a one-to-one relationship between data inputs and gates, in this embodiment, each data input may be provided to one or more of the gates 42-1 through 42-$N_D$ in order to provide the desired weighting for the data input. Thus, in this example, data input DATA 0 is provided to two gates, namely, gates 42-1 and 42-2; data input DATA 1 is provided to one gate, namely, gate 42-3; and data input DATA 2 is provided to three gates, namely, gates 42-4 through 42-6.

Similarly, as illustrated in FIG. 5B, in this embodiment, the threshold gate network 14 is implemented as a number of gates 44-1 through 44-$N_T$ connected in parallel as shown. In contrast to the embodiments discussed above wherein there is a one-to-one relationship between threshold inputs and gates, in this embodiment, each threshold input may be provided to one or more of the gates 44-1 through 44-$N_T$ in order to provide the desired weighting for the threshold input. Thus, in this example, threshold input THRESHOLD 0 is provided two gates, namely, gates 44-1 and 44-2; threshold input THRESHOLD 1 is provided to one gate, namely, gate 44-3; and threshold input THRESHOLD 2 is provided to three gates, namely, gates 44-4 through 44-6.

Figure 6A:
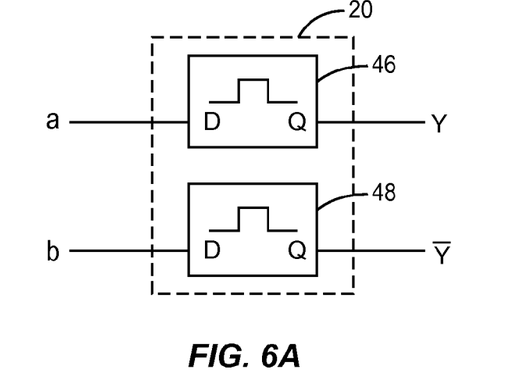
FIGS. 6A through 6C illustrate exemplary embodiments of the output component of the TLL of FIG. 1.
Figure 6B:
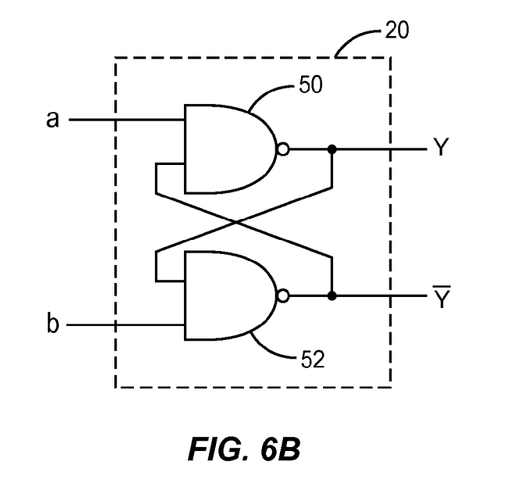
Figure 6C:
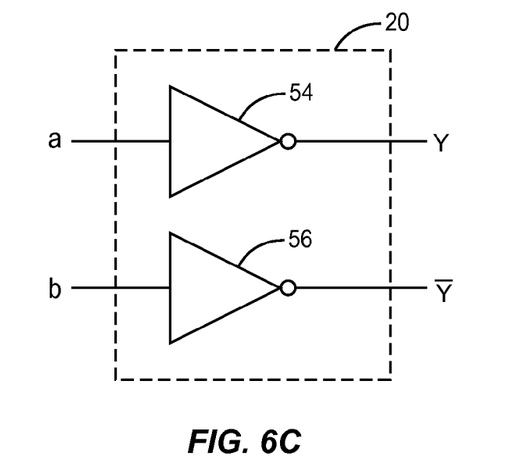

FIGS. 6A through 6C illustrate exemplary embodiments of the output component 20 of the TLL 10 of FIG. 1. More specifically, FIG. 6A illustrates an embodiment wherein the output component 20 is implemented as a pair of synchronous D latches 46 and 48. The operational details of the D latches 46 and 48 will be appreciated by one of ordinary skill in the art upon reading this disclosure. FIG. 6B illustrates an embodiment wherein the output component 20 is implemented as an asynchronous Set-Reset (SR) latch formed by a pair of cross-coupled NAND gates 50 and 52. The operational details of the SR latch will be appreciated by one of ordinary skill in the art upon reading this disclosure. FIG. 6C illustrates an embodiment wherein the output component 20 is implemented as a pair of inverters 54 and 56. The operational details of the inverters 54 and 56 will be appreciated by one of ordinary skill in the art upon reading this disclosure. The embodiment of FIG. 6C may be desirable in implementations where the output state of the output component 20 should not be held during the reset state of the TLL 10 or in implementations where the output state of the output component 20 does not need to be held during the reset state of the TLL 10.

Figure 7:
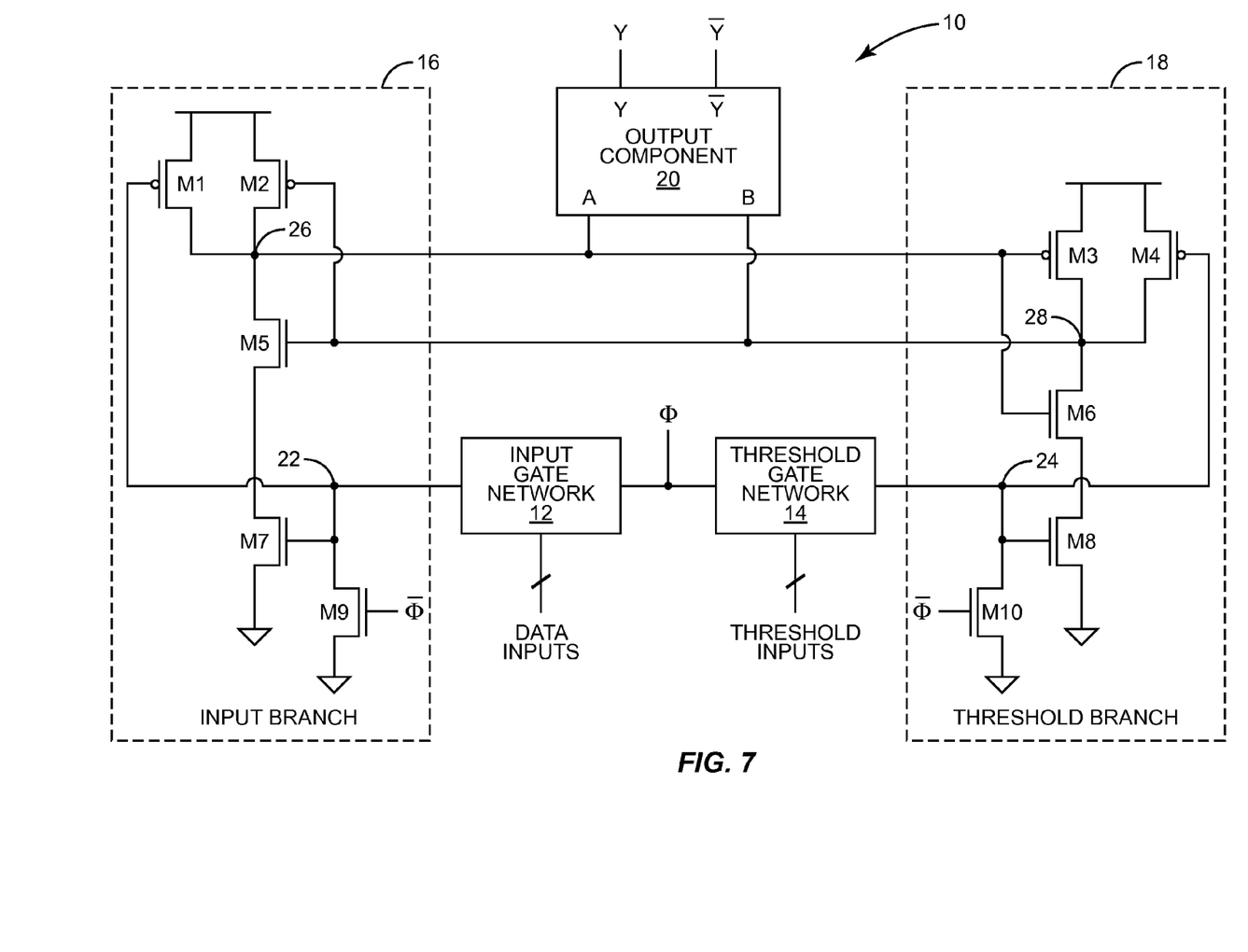
FIG. 7 illustrates a second embodiment of a TLL.

FIG. 7 illustrates a second embodiment of the TLL 10 that is substantially the same as the embodiment discussed above with respect to FIG. 1. However, in this embodiment, the input branch 16 further includes a transistor M9 connected to the isolated control input 22 as shown, and the threshold branch 18 further includes a transistor M10 connected to the isolated control input 24 as shown. In operation, when the TLL 10 is in the reset state, the bias signal Φ, or more specifically an inverted version of the bias signal Φ, activates the transistors M9 and M10 to pull the isolated control inputs 22 and 24, and thus the outputs of the input and threshold gate networks 12 and 14, to ground. The transistors M9 and M10 ensure that the isolated control inputs 22 and 24, and thus the outputs of the input and threshold gate networks 12 and 14, are fully discharged when the TLL 10 is in the reset state.

Figure 8:
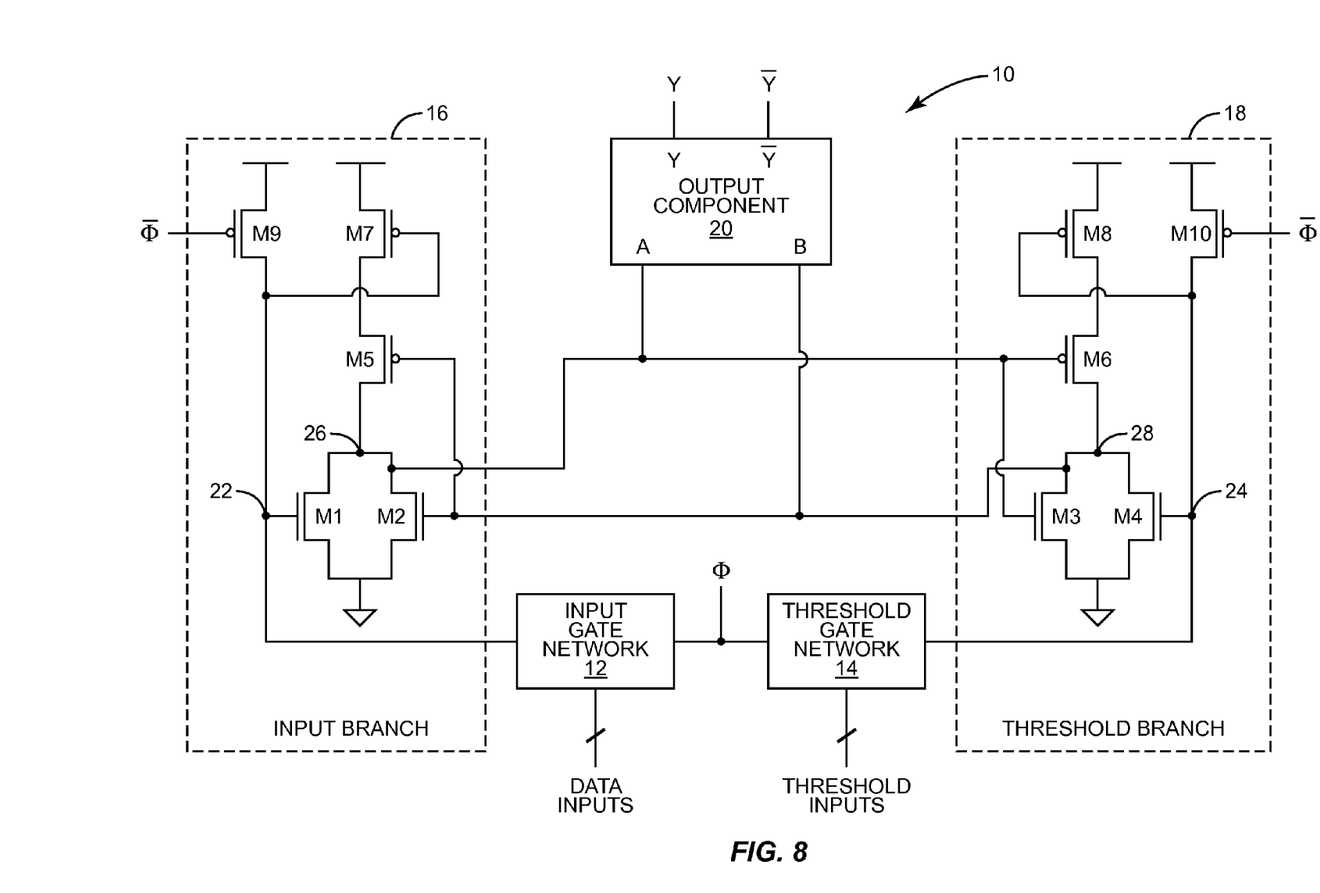
FIG. 8 illustrates a third embodiment of a TLL.

FIG. 8 illustrates a third embodiment of the TLL 10 that is substantially the same as the embodiment discussed above with respect to FIG. 1. However, in this embodiment, NMOS devices in the input and threshold branches 16 and 18 have been replaced with PMOS devices, and PMOS devices in the input and threshold branches 16 and 18 have been replaced with NMOS devices. Accordingly, the differential network formed by the input and threshold branches 16 and 18 is reversed. As a result, the input and threshold branches 16 and 18 operate in a pull-up rather than a pull-down fashion.

More specifically, in this embodiment, the bias signal Φ is at a voltage level corresponding to a logic "1" for the reset state. In the reset state, since the bias signal Φ is at a logic "1," the outputs of the input and threshold gate networks 12 and 14, and thus the isolated control inputs 22 and 24 of the input and threshold branches 16 and 18, are driven to a voltage level corresponding to a logic "1." In response to the isolated control input 22 being pulled high, the transistor M1 turns on, and the transistor M7 turns off such that the output node 26 of the input branch 16 is pulled to ground, which is a voltage level corresponding to a logic "0." In response to the output node 26 being pulled to a logic "0," the transistor M3 of the threshold branch 18 is turned off, and the transistor M6 of the threshold branch 18 is turned on. Likewise, in response to the isolated control input 24 being pulled high, the transistor M4 turns on, and the transistor M8 turns off such that the output node 28 of the threshold branch 18 is pulled to ground, which is a voltage level corresponding to a logic "0." In response to the output node 28 being pulled to a logic "0," the transistor M2 of the input branch 16 is turned off, and the transistor M5 of the input branch 16 is turned on. At this point, the output nodes 26 and 28 are at a logic "0," and the TLL 10 is primed for evaluation.

Then, on the falling edge of the bias signal Φ, the TLL 10 transitions to the evaluation state. In this embodiment, in the evaluation state, the input and threshold gate networks 12 and 14 perform a current race to discharge, rather than charge, their output nodes, and thus the isolated control inputs 22 and 24 of the input and threshold branches 16 and 18, to a logic "0." If the input gate network 12 wins the current race, the input gate network 12 drives the isolated control input 22 of the input branch 16 to a logic "0." In response, the transistor M1 is turned off, and the transistor M7 is turned on. As a result, the output node 26 is pulled to a logic "1" through the transistor M5, which is on at this point as a result of the reset state, and the transistor M7. In response to the output node 26 of the input branch 16 being pulled to a logic "1," the transistor M3 of the threshold branch 18 is turned on, and the transistor M6 of the threshold branch 18 is turned off. As a result, when the output of the threshold gate network 14 is subsequently driven low, the transistor M6 is off, thereby preventing charging of the output node 28 of the threshold branch 18 and causing the output node 28 of the threshold branch 18 to remain at a logic "0."

In contrast, if the threshold gate network 14 wins the current race, the threshold gate network 14 drives the isolated control input 24 of the threshold branch 18 to a logic "0." In response, the transistor M4 is turned off, and the transistor M8 is turned on. As a result, the output node 28 is pulled to a logic "1" through the transistor M6, which is on at this point as a result of the reset state, and the transistor M8. In response to the output node 28 of the threshold branch 18 being pulled to a logic "1," the transistor M2 of the input branch 16 is turned on, and the transistor M5 of the input branch 16 is turned off. As a result, when the output of the input gate network 12 is subsequently driven high, the transistor M5 is off, thereby preventing charging of the output node 26 of the input branch 16 and causing the output node 26 of the input branch 16 to remain at a logic "0."

In addition, in this embodiment, the input branch 16 includes the transistor M9, and the threshold branch 18 includes the transistor M10. The transistors M9 and M10 are optional. In this embodiment, the transistors M9 and M10 are PMOS transistors and are driven by the inverted bias signal Φ. As such, the transistors M9 and M10 are active during the reset state and operate to ensure that the isolated control inputs 22 and 24 of the input and threshold branches 16 and 18 are completely charged to a logic "1" in the reset state.

Figure 9:
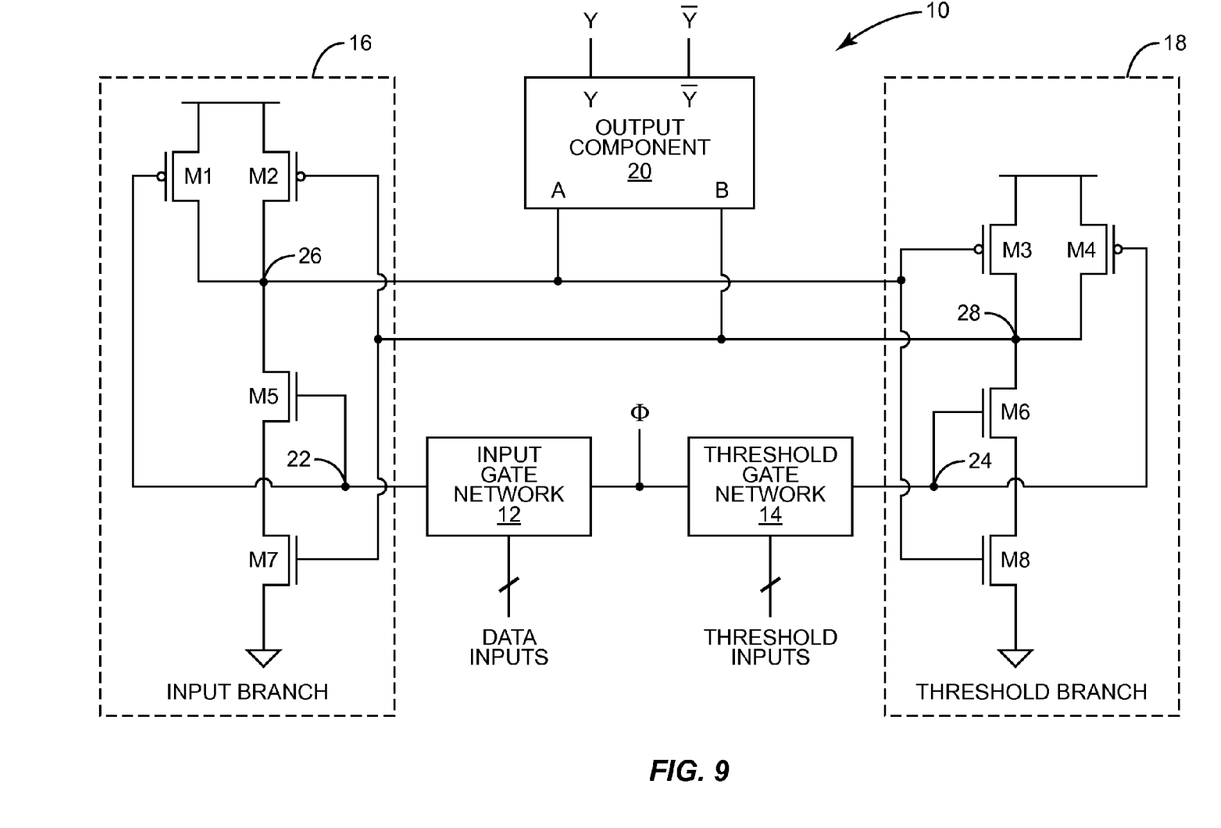
FIG. 9 illustrates a fourth embodiment of a TLL.

FIG. 9 illustrates a fourth embodiment of the TLL 10 that is similar to the embodiment of the TLL 10 illustrated in FIG. 1. However, in this embodiment, the output of the input gate network 12 is coupled to the gate of the transistor M5 rather than the gate of the transistor M7. In addition, the gate of the transistor M7, rather than the gate of the transistor M5, is coupled to the output node 28 of the threshold branch 18. Likewise, the output of the threshold gate network 14 is coupled to the gate of the transistor M6 rather than the gate of the transistor M8. In addition, the gate of the transistor M8, rather than the gate of the transistor M6, is coupled to the output node 26 of the input branch 16.

The operation of the TLL 10 of FIG. 9 is substantially the same as that of FIG. 1. More specifically, the TLL 10 of FIG. 9 operates in two states: a reset state and an evaluation state. The state of the TLL 10 is controlled by the bias signal Φ. In order to enter the reset state, the bias signal Φ is set to a voltage level corresponding to a logic "0." As a result, the input and threshold gate networks 12 and 14 are deactivated such that the outputs of the input and threshold gate networks 12 and 14, and thus the isolated control inputs 22 and 24 of the input and threshold branches 16 and 18, are discharged or pulled to a voltage level corresponding to a logic "0." When the isolated control inputs 22 and 24 of the input and threshold branches 16 and 18 are pulled to a logic "0," the transistors M5 and M6 are inactive and the transistors M1 and M4 are active. As a result, the output nodes 26 and 28 of the input and threshold branches 16 and 18, respectively, are pulled to a logic "1" via the transistors M1 and M4. Once reset is complete, the transistors M1, M4, M7, and M8 are active, and the remaining transistors M2, M3, M5 and M6 are inactive. At this point, the TLL 10 is primed for evaluation.

On the rising edge of the bias signal Φ, the TLL 10 transitions to the evaluation state. In the evaluation state, either the output node 26 of the input branch 16 or the output node 28 of the threshold branch 18 is pulled to a logic "0," which may result in a transition in the outputs Y and Y' of the output component 20. More specifically, as the bias signal Φ rises, a current race begins between the input and threshold gate networks 12 and 14. If the input gate network 12 wins the current race, the output of the input gate network 12, and thus the isolated control input 22 of the input branch 16, reaches a logic "1" before the output of the threshold gate network 14, and thus the isolated control input 24 of the threshold branch 18, reaches a logic "1." As the isolated control input 22 of the input branch 16 reaches a logic "1," the transistor M1, which is a PMOS device, becomes inactive, thereby cutting off the path from the output node 26 of the input branch 16 to the supply voltage. In addition, the transistor M5, which is an NMOS device, becomes active, thereby pulling the output node 26 of the input branch 16 towards ground through the transistor M7, which is active. As the output node 26 of the input branch 16 discharges, the transistor M3 of the threshold branch 18, which is a PMOS device, becomes active and the transistor M8 of the threshold branch 18, which is an NMOS device, becomes inactive. Thus, at some point thereafter when the output of the threshold gate network 14 reaches a logic "1," the output node 28 of the threshold branch 18 does not discharge. At the end of the evaluation, the output node 26 of the input branch 16 is at a logic "0," and the output node 28 of the threshold branch 18 is at a logic "1." The outputs Y and Y' of the output component 20 are adjusted accordingly by the output component 20.

Similarly, if the threshold gate network 14 wins the current race, the output of the threshold gate network 14, and thus the isolated control input 24 of the threshold branch 18, reaches a logic "1" before the output of the input gate network 12, and thus the isolated control input 22 of the input branch 16, reaches a logic "1." As the isolated control input 24 of the threshold branch 18 reaches a logic "1," the transistor M4, which is a PMOS device, becomes inactive, thereby cutting off the path from the output node 28 of the threshold branch 18 to the supply voltage. In addition, the transistor M6, which is an NMOS device, becomes active, thereby pulling the output node 28 of the threshold branch 18 towards ground through the transistor M8, which is active. As the output node 28 of the threshold branch 18 discharges, the transistor M2 of the input branch 16, which is a PMOS device, becomes active and the transistor M7 of the input branch 16, which is an NMOS device, becomes inactive. Thus, at some point thereafter when the output of the input gate network 12, and thus the isolated control input 22 of the input branch 16, reaches a logic "1," the output node 26 of the input branch 16 does not discharge. At the end of the evaluation, the output node 26 of the threshold branch 18 is at a logic "1," and the output node 28 of the threshold branch 18 is at a logic "0." The outputs Y and Y' of the output component 20 are adjusted accordingly by the output component 20.

Note that after evaluation completes, all nodes in the TLL 10 have a closed path to either the supply voltage or ground. Because of this, the outputs are latched, and no change in the active number of transmission gates in either of the input and threshold gate networks 12 and 14 will have any effect on the values at the outputs until the beginning of the next evaluation.

Those skilled in the art will recognize improvements and modifications to the preferred embodiments of the present invention. All such improvements and modifications are considered within the scope of the concepts disclosed herein and the claims that follow.

What is claimed is:

1. A threshold logic element comprising:
   a differential circuit comprising:
      an input branch comprising an input and an output, the output being either charged or discharged via a current conducting path of the input branch under control of the input of the input branch and the input of the input branch being isolated from the current conducting path of the input branch; and
      a threshold branch comprising an input and an output, the output being either charged or discharged via a current conducting path of the threshold branch under control of the input of the threshold branch and the input of the threshold branch being isolated from the current conducting path of the threshold branch;
   an input gate network receiving a plurality of data inputs and having an output coupled to the input of the input branch such that the input gate network does not form part of the current conducting path of the input branch; and
   a threshold gate network receiving a plurality of threshold inputs and having an output coupled to the input of the threshold branch such that the threshold gate network does not form part of the current conducting path of the threshold branch.

2. The threshold logic element of claim 1 wherein when the threshold logic element is controlled to first operate in a reset state and then transition to an evaluation state.

3. The threshold logic element of claim 2 wherein:
   the input gate network comprises a plurality of gates driven by the plurality of data inputs and is controlled such that:
      when the threshold logic element is in the reset state, the output of the input gate network drives the input of the input branch to a voltage level corresponding to a first logic value; and
      when the threshold logic element is in the evaluation state, the output of the input gate network drives the input of the input branch to a voltage level corresponding to a second logic value as a function of a number of the plurality of gates in the input gate network that are activated by the plurality of data inputs; and
   the threshold gate network comprises a plurality of gates driven by the plurality of threshold inputs and is controlled such that:
      when the threshold logic element is in the reset state, the output of the threshold gate network drives the input of the threshold branch to a voltage level corresponding to the first logic value; and
      when the threshold logic element is in the evaluation state, the output of the threshold gate network drives the input of the threshold branch to a voltage level corresponding to the second logic value as a function of a number of the plurality of gates in the threshold gate network that are activated by the plurality of threshold inputs.

4. The threshold logic element of claim 3 wherein:
   the input branch is adapted to charge the output of the input branch to a voltage level corresponding to a high logic value in response to the input of the input branch being driven to the voltage level corresponding to the first logic value by the input gate network when the threshold logic element is in the reset state; and
   the threshold branch is adapted to charge the output of the threshold branch to a voltage level corresponding to the high logic value in response to the input of the threshold branch being driven to the voltage level corresponding to the first logic value by the threshold gate network when the threshold logic element is in the reset state.

5. The threshold logic element of claim 4 wherein when the threshold logic element is in the evaluation state and the input gate network drives the input of the input branch to the voltage level corresponding to the second logic value before the threshold gate network drives the input of the threshold branch to the voltage level corresponding to the second logic value, the input branch is further adapted to:
   discharge the output of the input branch to a voltage level corresponding to a low logic value in response to the input of the input branch being driven to the voltage level corresponding to the second logic value; and deactivate the threshold branch such that the output of the threshold branch remains at the high logic value.

6. The threshold logic element of claim 5 wherein when the threshold logic element is in the evaluation state and the threshold gate network drives the input of the threshold branch to the voltage level corresponding to the second logic value before the input gate network drives the input of the input branch to the voltage level corresponding to the second logic value, the threshold branch is further adapted to:

discharge the output of the threshold branch to a voltage level corresponding to the low logic value in response to the input of the threshold branch being driven to the voltage level corresponding to the second logic value; and deactivate the input branch such that the output of the input branch remains at the high logic value.

7. The threshold logic element of claim 6 wherein the first logic value is the low logic value, and the second logic value is the high logic value.

8. The threshold logic element of claim 3 wherein:

the input branch is adapted to discharge the output of the input branch to a voltage level corresponding to a low logic value in response to the input of the input branch being driven to the voltage level corresponding to the first logic value by the input gate network when the threshold logic element is in the reset state; and the threshold branch is adapted to discharge the output of the threshold branch to a voltage level corresponding to the low logic value in response to the input of the threshold branch being driven to the voltage level corresponding to the first logic value by the threshold gate network when the threshold logic element is in the reset state.

9. The threshold logic element of claim 8 wherein when the threshold logic element is in the evaluation state and the input gate network drives the input of the input branch to the voltage level corresponding to the second logic value before the threshold gate network drives the input of the threshold branch to the voltage level corresponding to the second logic value, the input branch is further adapted to:

charge the output of the input branch to a voltage level corresponding to a high logic value in response to the input of the input branch being driven to the voltage level corresponding to the second logic value; and deactivate the threshold branch such that the output of the threshold branch remains at the low logic value.

10. The threshold logic element of claim 9 wherein when the threshold logic element is in the evaluation state and the threshold gate network drives the input of the threshold branch to the voltage level corresponding to the second logic value before the input gate network drives the input of the input branch to the voltage level corresponding to the second logic value, the threshold branch is further adapted to:

charge the output of the threshold branch to a voltage level corresponding to the high logic value in response to the input of the threshold branch being driven to the voltage level corresponding to the second logic value; and deactivate the input branch such that the output of the input branch remains at the low logic value.

11. The threshold logic element of claim 10 wherein the first logic value is the high logic value, and the second logic value is the low logic value.

12. The threshold logic element of claim 1 wherein the input gate network comprises a plurality of transmission gates connected in parallel, wherein each of the plurality of data inputs is provided to one or more of the plurality of transmission gates.

13. The threshold logic element of claim 1 wherein the input gate network comprises a plurality of p-type pass gates connected in parallel, wherein each of the plurality of data inputs is provided to one or more of the plurality of p-type pass gates.

14. The threshold logic element of claim 1 wherein the input gate network comprises a plurality of n-type pass gates connected in parallel, wherein each of the plurality of data inputs is provided to one or more of the plurality of n-type pass gates.

15. The threshold logic element of claim 1 wherein the threshold gate network comprises a plurality of transmission gates connected in parallel, wherein each of the plurality of threshold inputs is provided to one or more of the plurality of transmission gates.

16. The threshold logic element of claim 1 wherein the threshold gate network comprises a plurality of p-type pass gates connected in parallel, wherein each of the plurality of threshold inputs is provided to one or more of the plurality of p-type pass gates.

17. The threshold logic element of claim 1 wherein the threshold gate network comprises a plurality of n-type pass gates connected in parallel, wherein each of the plurality of threshold inputs is provided to one or more of the plurality of n-type pass gates.

18. The threshold logic element of claim 1 wherein the input gate network comprises a plurality of gates connected in parallel, wherein each data input of the plurality of data inputs is provided to one or more of the plurality of gates and a desired weighting is applied to the data input as a result of at least one of a group consisting of: a number of gates to which the data input is provided and a size of the one or more of the plurality of gates to which the data input is provided.

19. The threshold logic element of claim 1 wherein the threshold gate network comprises a plurality of gates connected in parallel, wherein each threshold input of the plurality of threshold inputs is provided to one or more of the plurality of gates and a desired weighting is applied to the threshold input as a result of at least one of a group consisting of: a number of gates to which the threshold input is provided and a size of the one or more of the plurality of gates to which the threshold input is provided.

20. The threshold logic element of claim 1 further comprising an output component having a first input coupled to the output of the input branch and a second input coupled to the output of the threshold branch and that operates to provide a differential output based on the output of the input branch and the output of the threshold branch.

21. The threshold logic element of claim 1 wherein:
a) the input branch comprises:
i) a first n-type transistor having a control terminal corresponding to the input of the input branch that is coupled to the output of the input gate network, a second terminal coupled to a first reference voltage corresponding to a low logic value, and a third terminal;
ii) a second n-type transistor having a control terminal, a second terminal coupled to the third terminal of the first n-type transistor, and a third terminal;
iii) a first p-type transistor having a control terminal coupled to the control terminal of the second n-type transistor and the output of the threshold branch, a second terminal coupled to the third terminal of the second n-type transistor, and a third terminal coupled to a second reference voltage corresponding to a high logic value; and iv) a second p-type transistor having a control input coupled to the input of the input branch that is coupled to the output of the input gate network, a second terminal coupled to the third terminal of the second n-type transistor and the second terminal of the first p-type transistor, and a third terminal coupled to the second reference voltage, wherein a node interconnecting the third terminal of the second n-type transistor and the second terminals of the first and second p-type transistors provides the output of the input branch; and b) the threshold branch comprises:

i) a third n-type transistor having a control terminal corresponding to the input of the threshold branch that is coupled to the output of the threshold gate network, a second terminal coupled to the first reference voltage corresponding to the low logic value, and a third terminal;

ii) a fourth n-type transistor having a control terminal, a second terminal coupled to the third terminal of the third n-type transistor, and a third terminal;

iii) a third p-type transistor having a control terminal coupled to the control terminal of the fourth n-type transistor and the output of the input branch, a second terminal coupled to the third terminal of the fourth n-type transistor, and a third terminal coupled to the second reference voltage corresponding to the high logic value; and iv) a fourth p-type transistor having a control input coupled to the input of the threshold branch that is coupled to the output of the threshold gate network, a second terminal coupled to the third terminal of the fourth n-type transistor and the second terminal of the third p-type transistor, and a third terminal coupled to the second reference voltage, wherein a node interconnecting the third terminal of the fourth n-type transistor and the second terminals of the third and fourth p-type transistors provides the output of the threshold branch.

22. The threshold logic element of claim 1 wherein:

a) the input branch comprises:

i) a first n-type transistor having a control terminal, a second terminal coupled to a first reference voltage corresponding to a low logic value, and a third terminal;

ii) a second n-type transistor having a control terminal corresponding to the input of the input branch that is coupled to the output of the input gate network, a second terminal coupled to the third terminal of the first n-type transistor, and a third terminal;

iii) a first p-type transistor having a control terminal coupled to the control terminal of the first n-type transistor and the output of the threshold branch, a second terminal coupled to the third terminal of the second n-type transistor, and a third terminal coupled to a second reference voltage corresponding to a high logic value; and iv) a second p-type transistor having a control input coupled to the isolated input of the input branch that is coupled to the output of the input gate network, a second terminal coupled to the third terminal of the second n-type transistor and the second terminal of the first p-type transistor, and a third terminal coupled to the second reference voltage, wherein a node interconnecting the third terminal of the second n-type transistor and the second terminals of the first and second p-type transistors provides the output of the input branch; and b) the threshold branch comprises:

i) a third n-type transistor having a control terminal, a second terminal coupled to the first reference voltage corresponding to the low logic value, and a third terminal;

ii) a fourth n-type transistor having a control terminal corresponding to the input of the threshold branch that is coupled to the output of the threshold gate network, a second terminal coupled to the third terminal of the third n-type transistor, and a third terminal;

iii) a third p-type transistor having a control terminal coupled to the control terminal of the third n-type transistor and the output of the input branch, a second terminal coupled to the third terminal of the fourth n-type transistor, and a third terminal coupled to the second reference voltage corresponding to the high logic value; and iv) a fourth p-type transistor having a control input coupled to the input of the threshold branch that is coupled to the output of the threshold gate network, a second terminal coupled to the third terminal of the fourth n-type transistor and the second terminal of the third p-type transistor, and a third terminal coupled to the second reference voltage, wherein a node interconnecting the third terminal of the fourth n-type transistor and the second terminals of the third and fourth p-type transistor provides the output of the threshold branch.

23. The threshold logic element of claim 1 wherein:

a) the input branch comprises:

i) a first p-type transistor having a control terminal corresponding to the input of the input branch that is coupled to the output of the input gate network, a second terminal coupled to a first reference voltage corresponding to a high logic value, and a third terminal;

ii) a second p-type transistor having a control terminal, a second terminal coupled to the third terminal of the first p-type transistor, and a third terminal;

iii) a first n-type transistor having a control terminal coupled to the control terminal of the second p-type transistor and the output of the threshold branch, a second terminal coupled to the third terminal of the second p-type transistor, and a third terminal coupled to a second reference voltage corresponding to a low logic value; and iv) a second n-type transistor having a control input coupled to the input of the input branch that is coupled to the output of the input gate network, a second terminal coupled to the third terminal of the second p-type transistor and the second terminal of the first n-type transistor, and a third terminal coupled to the second reference voltage, wherein a node interconnecting the third terminal of the second p-type transistor and the second terminals of the first and second n-type transistors provides the output of the input branch; and b) the threshold branch comprises:

i) a third p-type transistor having a control terminal corresponding to the input of the threshold branch that is coupled to the output of the threshold gate network, a second terminal coupled to the first reference voltage corresponding to the high logic value, and a third terminal;

ii) a fourth p-type transistor having a control terminal, a second terminal coupled to the third terminal of the third p-type transistor, and a third terminal;

iii) a third n-type transistor having a control terminal coupled to the control terminal of the fourth p-type transistor and the output of the input branch, a second terminal coupled to the third terminal of the fourth p-type transistor, and a third terminal coupled to the second reference voltage corresponding to the low logic value; and iv) a fourth n-type transistor having a control input coupled to the input of the threshold branch that is coupled to the output of the threshold gate network, a second terminal coupled to the third terminal of the fourth p-type transistor and the second terminal of the third n-type transistor, and a third terminal coupled to the second reference voltage, wherein a node interconnecting the third terminal of the fourth p-type transistor and the second terminals of the third and fourth n-type transistors provides the output of the threshold branch.

* * * * *